United States Patent [19]

Hashimoto

[11] Patent Number: 5,275,962
[45] Date of Patent: Jan. 4, 1994

[54] MASK PROGRAMMABLE GATE ARRAY BASE CELL

[75] Inventor: Masashi Hashimoto, Garland, Tex.

[73] Assignee: Texas Instruments Incorporated, Dallas, Tex.

[21] Appl. No.: 682,805

[22] Filed: Apr. 8, 1991

[51] Int. Cl.$^5$ .................................. H01L 21/265
[52] U.S. Cl. ........................... 437/48; 437/51; 437/40; 257/390
[58] Field of Search ............ 437/43, 48, 51, 52, 437/919; 148/DIG.; 365/149; 357/23.5; 257/390, 391, 209, 202, 203, 210

[56] References Cited

U.S. PATENT DOCUMENTS

| | | | |
|---|---|---|---|
| 4,554,729 | 11/1985 | Tanimura et al. | 148/DIG. 82 |
| 4,975,756 | 12/1990 | Haken et al. | 357/51 |
| 5,026,657 | 6/1991 | Lee et al. | 437/52 |
| 5,081,056 | 1/1992 | Mazzali et al. | 437/43 |
| 5,120,571 | 6/1992 | Gill et al. | 437/51 |
| 5,136,356 | 8/1992 | Sakuda et al. | 437/51 |

FOREIGN PATENT DOCUMENTS

| | | | |
|---|---|---|---|
| 1-65873 | 3/1989 | Japan | 437/34 |
| 2-246150 | 10/1990 | Japan | 437/52 |
| 2-312271 | 12/1990 | Japan | 437/52 |

Primary Examiner—Robert Kunemund
Assistant Examiner—H. Jey Tsai
Attorney, Agent, or Firm—Ira S. Matsil; James C. Kesterson; Richard L. Donaldson

[57] ABSTRACT

A method of forming a semiconductor gate array structure on a semiconductor substrate comprises the steps of forming a plurality of moat regions 12 and 14 where each of the moat regions 12 and 14 includes a channel region 22 and 28 and an insulating layer formed over the channel region 22 and 28. The moat regions separated by an insulating region 16. A plurality of gates 30 are formed wherein each of said gates 30 includes a first portion 30a over one of said channel regions 22, a second portion 30b over a channel region 28 adjacent to said one of said channel regions, and a third portion 30c over the insulating region 116 between said one of said channel regions. The gates 30 are formed such that each channel region is beneath one gate. The third portion 30a of a selected number of the gates is then etched to form the desired gate configuration. Finally, an additional insulating layer 160 may be formed over the array and contact holes formed in the layer such that interconnects may be created to form the desired transistor devices. Multiple levels of interconnects may be used. Modifications and variations, as well as an illustrative fabrication method are also disclosed.

20 Claims, 7 Drawing Sheets

MASK PROGRAMMABLE GATE ARRAY BASE CELL

FIELD OF THE INVENTION

This invention generally relates to semiconductor devices and their fabrication and specifically to a mask programmable gate array structure and method for forming the same.

BACKGROUND OF THE INVENTION

In the fabrication of integrated circuits it is often necessary to form a large number of transistors on a single chip. These transistors are interconnected to form logic gates, flip-flops, memory cells and a wide variety of other devices. A gate array is an array of transistor circuits which utilize the same base cell for many different applications. In this configuration, only the final interconnect levels of the multilevel device are specifically designed for any given application. The initial levels, known as the base cell, are the same for each implementation. In typical applications the base cell includes a heavily doped moat region separated by lightly doped channel region and a gate insulatively overlying the channel region.

One type of gate array includes moat regions which comprise p-doped silicon and other moat regions which comprise n-doped silicon. These regions can be used to create p-channel and n-channel devices, respectively. One example of an application which uses both conductivity type channels is a CMOS (complementary metal oxide semiconductor) device.

Many gate array applications require the gates of adjacent base cells to be connected electrically. This electrical connection is often made when the gates are formed during the base cell fabrication. Connected gates are common in CMOS devices such as inverters or NAND gates, for example.

In other applications, such as single or complementary transfer gates or some dynamic circuits for example, however, it is inefficient to "pre-connect" (i.e., connect during base cell fabrication) the gates of adjacent cells.

To solve the problem of having both gates that are connected and gates that are not connected, the entire base cell may be redesigned for each application. This custom design approach, however, is costly because more levels of the multilevel fabrication must be built for each specific application.

Another solution is to either connect all cell gate pairs or leave all cell gate pairs disconnected. This solution, however, leads to inefficient base cell usage.

Accordingly, improvements which overcome any or all of the problems are presently desirable.

SUMMARY OF THE INVENTION

Other objects and advantages will be obvious, and will in part appear hereinafter and will be accomplished by the present invention which provides a gate array base cell with a mask programmable gate.

A method of forming a semiconductor gate array structure on a semiconductor substrate comprises the steps of forming a plurality of moat regions where each of the moat regions includes a channel region and an insulating layer formed over the channel region. The moat regions are separated by an insulating region. A plurality of gates are formed wherein each of the gates includes a first portion over one of the channel regions, a second portion over a channel region adjacent to that one of the channel regions, and a third portion over the insulating region between the two channel regions. The gates are formed such that each channel region is beneath one gate. The third portion of a selected number of the gates is then etched to form the desired gate configuration. Finally, an additional insulating layer may be formed over the array and contact holes formed in the layer such that interconnects may be created to form the desired transistor devices. Multiple levels of interconnects may be used.

An advantage of the invention is that it provides a substantial area savings without requiring an additional interconnect level. The interconnect layout is much more flexible over prior art structures. This advantage is maintained without any significant additional fabrication costs.

BRIEF DESCRIPTION OF THE DRAWINGS

The above features of the present invention will be more clearly understood from consideration of the following descriptions in connection with accompanying drawings in which.

Corresponding numerals and symbols in the different figures refer to corresponding parts unless otherwise indicated.

DETAILED DESCRIPTION OF PREFERRED EMBODIMENTS

The making and use of the presently preferred embodiments are discussed below in detail. However, it should be appreciated that the present invention provides many applicable inventive concepts which can be embodied in a wide variety of specific contexts. The specific embodiments discussed are merely illustrative of specific way to make and use the invention, and do not delimit the scope of the invention.

The following is a description of the present invention. The invention will then be described with reference to one exemplary illustration. Several variations will then be described along with some examples of usage. Finally, one sample method of fabrication will be described.

Figure 1:
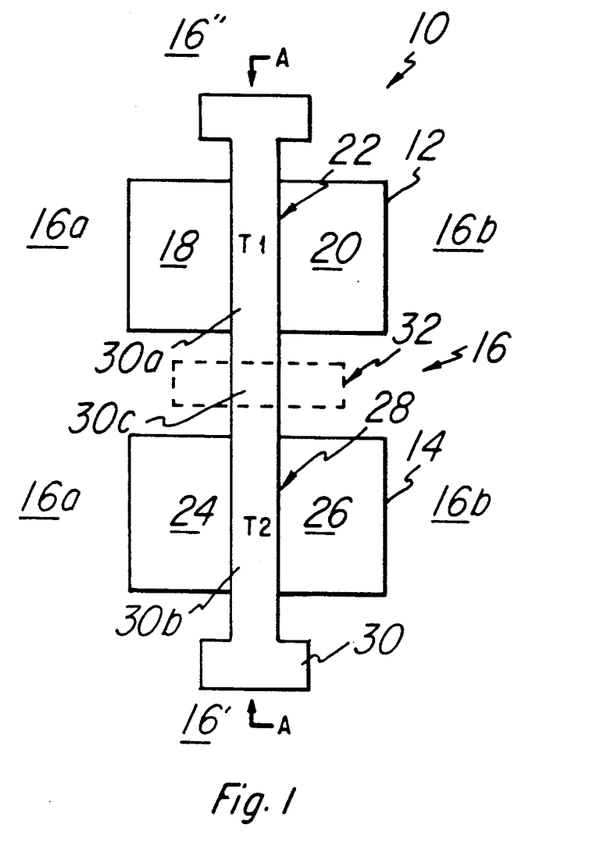
FIG. 1 is a top view layout of a preferred embodiment base cell.

Referring first to FIG. 1, a first preferred embodiment gate array base cell 10 is shown in top-view layout form. The cell includes a moat region 12 and a moat region 14 separated by an insulating region 16. Moat region 12 is separated into two portions 18 and 20 by channel region 22. Likewise, moat region 14 is separated into two portions 24 and 26 by channel region 28. The moat regions are isolated on all sides from like regions in the array by isolation region 16.

The moat regions 12 and 14 are typically formed from heavily doped silicon. In some applications, such as CMOS (complementary metal oxide semiconductor) devices for example, moat region 12 is formed from heavily p-doped silicon and moat region 14 is formed from heavily n-doped silicon, or vice versa. The channel region 22 or 28 is typically formed from lightly doped silicon. The conductivity of the channel 22 (or 28) is typically, but not necessarily, opposite that of the remainder of the moat region.

An insulating layer, not shown, is formed over the channel regions 22 and 28. The insulating layer typically comprises an oxide such as silicon dioxide or a nitride such as silicon nitride, for example.

A conductive gate 30 is formed over the insulating layers which cover the channel regions 22 and 28 and spans across insulation region 16 between region 12 and region 14. The gate typically comprises heavily doped polysilicon, for example. As shown, the gate includes a first portion 30a formed over moat region 12, a second portion 30b formed over moat region 14 and a third portion 30c formed over the insulating region 16 which separates the two moat regions.

Figure 6A:
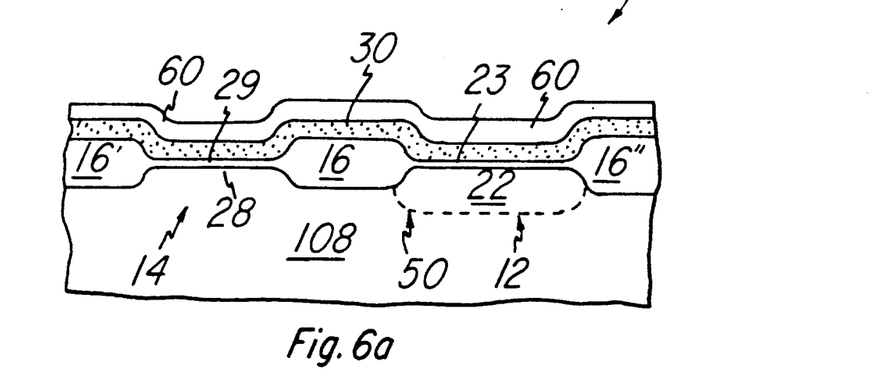
FIGS. 6a-6c are cross-sectional views illustrative of an exemplary gate etching method.
Figure 6B:
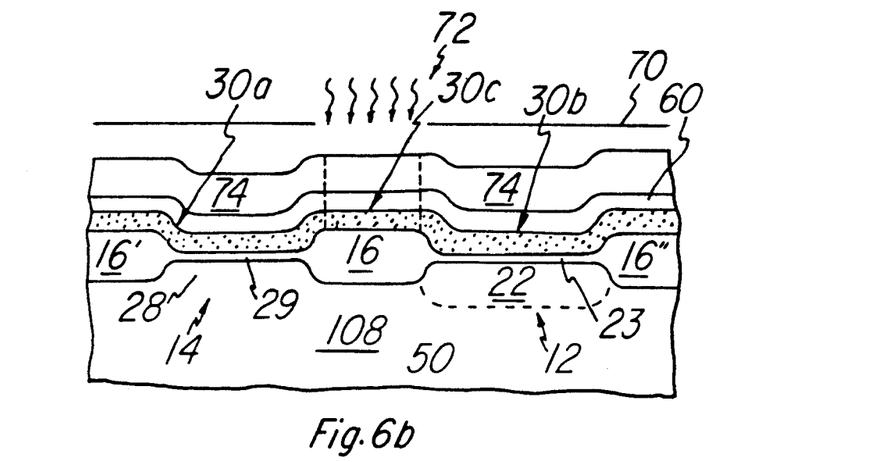
Figure 6C:
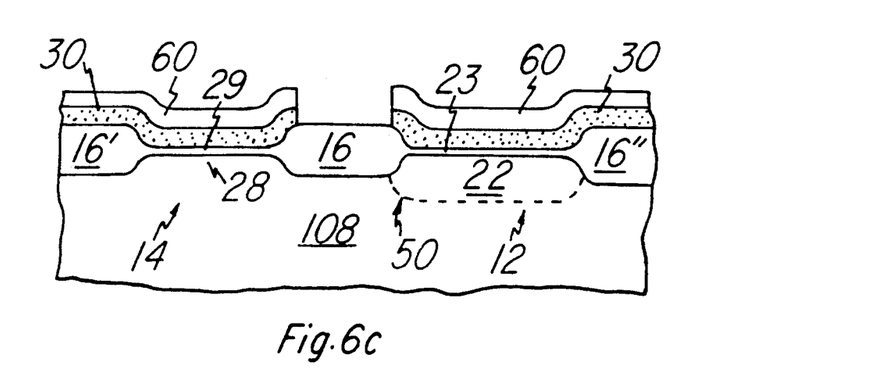

Also shown in the figure is gate window 32 which is illustrative of the portion 30c of gate 30 to be etched if the gate which overlies moat region 12 is to be electrically disconnected from the gate which overlies moat region 14. A method for etching the gate is shown in FIG. 6a–6c which show a cross-sectional view along the AA line of FIG. 1.

A transistor T1 is formed in moat region 12. Transistor T1 comprises source region 18, drain region 20 and gate 30. Likewise, transistor T2 is formed in moat region 14 and comprises source region 24, drain region 26, and gate 30. Of course, the source and drain may be reversed depending upon the application. As discussed above, gate 30 above transistor T1 may be separated from gate 30 above transistor T2 by etching the portion 30c within window 32.

The base cell 10 is one of many like cells in the array. Typical gate arrays may have as many as 300,000 to 500,000 cells or more. The cells are formed into the desired circuits by forming interconnects (not shown) between cells. The entire array is covered with an insulating material (not shown), such as an oxide for example. Contact holes (not shown) are formed in the insulating material to connect the interconnect line with the underlying structure. Interconnect technology, including multi-level interconnect technology, is well known in the current art. The interconnects are typically formed subsequent to etching the gates.

A large number of varying devices may be formed within the gate array. General logic circuits which utilize both n-channel and p-channel moat regions with connected gates include inverters and NAND gates. Other devices such as flip-flops, static random access memories, read only memories, or multi-port memories, for example, may be formed. Some circuits which require electrically uncoupled gates for the p-channel and n-channel device include single or complementary transfer gates or some dynamic circuits, as examples.

Figure 2:
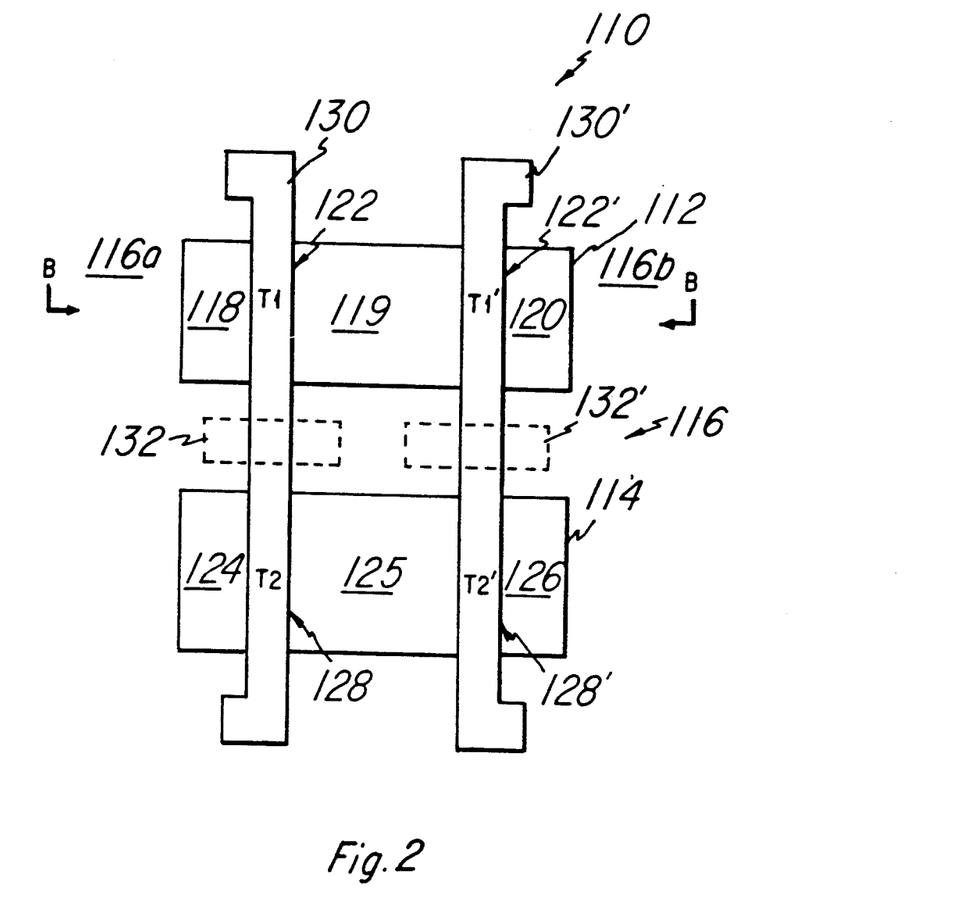
FIGS. 2-4 are top views of alternative embodiment base cells.

Many variations and modifications to the base cell of the present invention are possible. As shown in FIG. 2, the moat region 112 includes two channel regions 122 and 122'. Likewise, moat region 114 includes channel regions 128 and 128'. Gate 130 insulatively overlies channel regions 122 and 128 and gate 130' insulatively overlies channel regions 122' and 128'. In this configuration two transistors T1 and T1' (or T2 and T2') may be formed in each moat region. More than two gates can also be included in one moat region.

The gates 130 and 130' may be independently etched or left unetched at window 132 and 132', respectively. Of course, both gates 130 and 130' may be etched as required by the circuit application.

Figure 3:
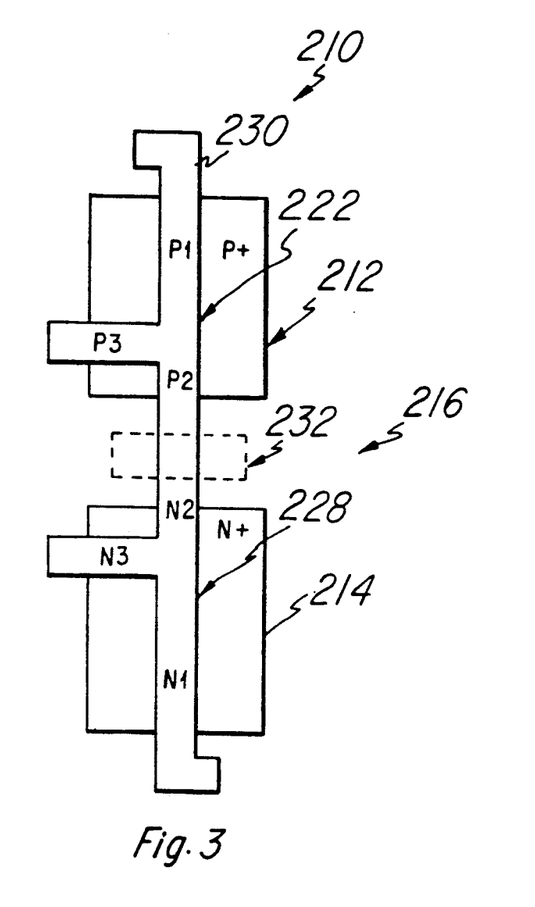

In another preferred embodiment, the base cell structure may include more than one transistor per gate in each moat region as shown in FIG. 3. A structure which provides more than one possible transistor per gate is described in co-pending patent application Ser. No. 681,822, now U.S. Pat. No. 5,217,915, incorporated herein by this reference.

The cell 210 illustrated in FIG. 3 is a typical CMOS cell. Moat region 212 is formed from p+ doped silicon and moat region 214 from n+ doped silicon. Gate 230 insulatively overlies the channel regions 222 and 228. In the embodiment illustrated, three transistors P1, P2 and P3 are formed in moat region 212. Likewise, three transistors N1, N2 and N3 are formed in moat region 214.

The gate 230 may be etched at window 232 to separate the portion which overlies channel region 222 from the portion which overlies channel region 228. The etching may be done for selected cells in the array as required by the circuit.

Figure 4:
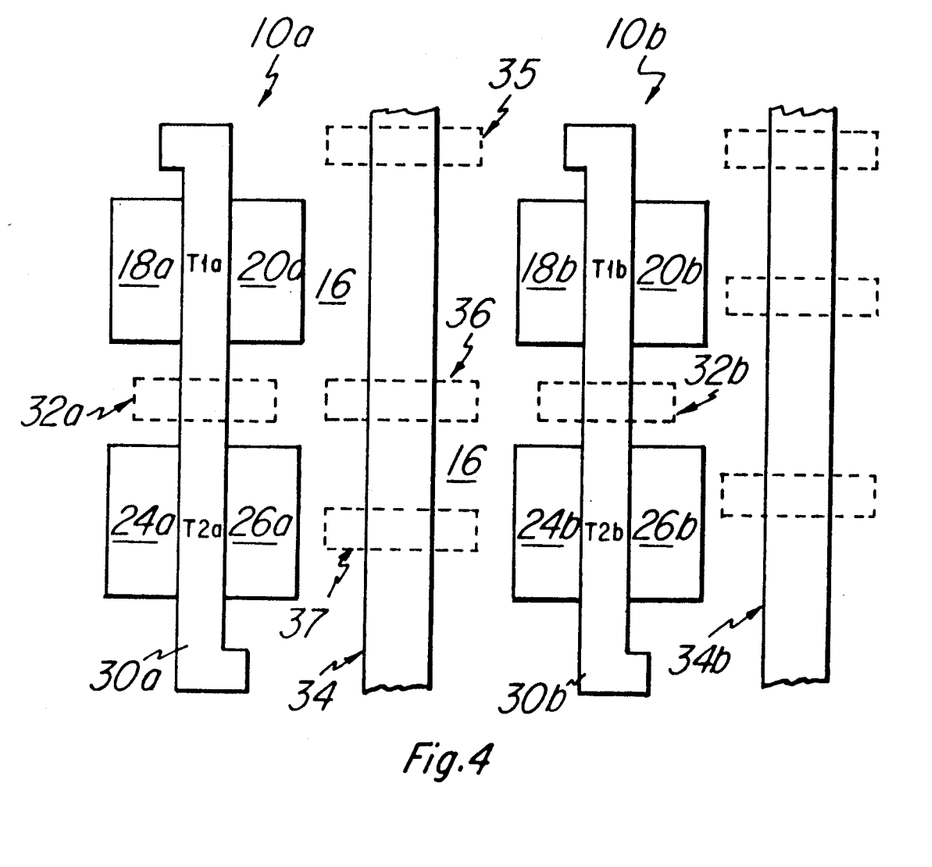

Another variation of the preferred embodiment base cell is shown in FIG. 4. FIG. 4 illustrates a top view of two of the base cells 10a and 10b as described with reference to FIG. 1. Also shown is interconnect line 34 which is formed in the insulation region between cell 10a and cell 10b. The interconnect line 34, sometimes referred to as a poly tunnel line, provides additional interconnect capability and is a part of the repetitive base cell pattern. The interconnect line 34 may typically comprise heavily doped polysilicon and may be formed at the same time as the moat regions.

The interconnect line 34 may be etched as desired in the same manner at the gate 30. Etch windows 35, 36 and 37 are illustrative of areas of the interconnect line 34 which may be etched. The portions which are etched are determined by the circuit design and can be anywhere along the interconnect line. Also illustrated in FIG. 4 is interconnect line 34b which is positioned between cell 10b and the next cell in the row (not shown). Windows 35b–37b are illustrated to show alternate portions of the interconnect line 34b being etched.

The modifications illustrated in FIG. 2, FIG. 3 and FIG. 4, as well as other modifications which will be obvious to those skilled in the art, may be combined to form a large number of possible base cell configurations.

The following description is illustrative of one possible method to form the structure of the present invention. The fabrication method will be described with reference to the cross-sectional drawings of FIG. 5. An exemplary method to etch the gates is described with reference to the cross-sectional drawing of FIG. 6.

Figure 5A:
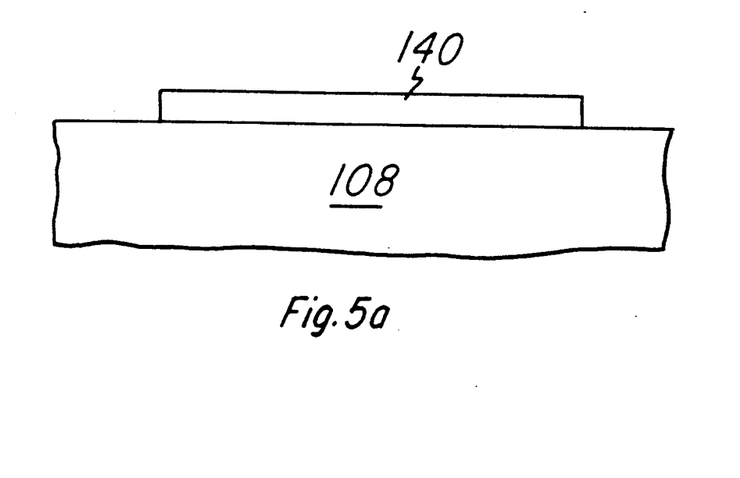
FIGS. 5a-5e are cross-sectional views illustrative of one method of fabrication.

Referring to FIG. 5a, a semiconductor substrate 108 is provided. In a preferred embodiment, the substrate 108 comprises lightly doped p-type silicon. The substrate 108 may also be lightly doped n-type silicon, for example. In the first step of the fabrication processed to be described, a masking layer 140, such as nitride for example, is deposited and etched to cover the active areas.

Figure 5B:
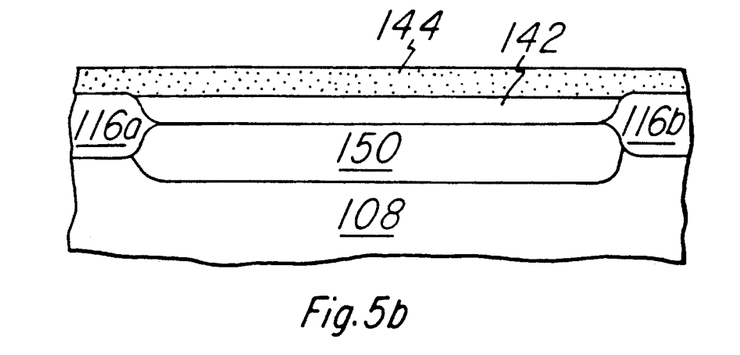

Referring now to FIG. 5b, a insulating regions 116a and 116b are formed on the substrate surface where the masking layer 140 is not present. One method which may be used is to thermally grow an oxide layer and form a silicon dioxide isolation region 116. After forming the isolation region 116, the masking layer 140 is removed.

If a p-doped substrate 108 is used and a p-channel device is required, then the next step of the illustrative process is to form n-well 150. The n-well 150 is formed using well known doping techniques such as implantation or diffusion, as examples. If a CMOS gate array is being formed, then some of the devices will be n-channel and the remaining devices p-channel. The figures illustrate a p-channel MOS fabrication step but it should be understood the CMOS fabrication can easily be accomplished with the inclusion of cells which do not include n-well as described above. Of course, if only n-channel devices are required in the array, no n-wells will be included.

Gate insulating layer 142 is formed in the active areas. The insulating layers typically comprise a deposited oxide, for example. Conducting layer 144 is then formed over the gate insulating layer 142. Conducting layer 144 typically comprises highly doped polysilicon, for example. Layer 144 may be deposited, for example.

Figure 5C:
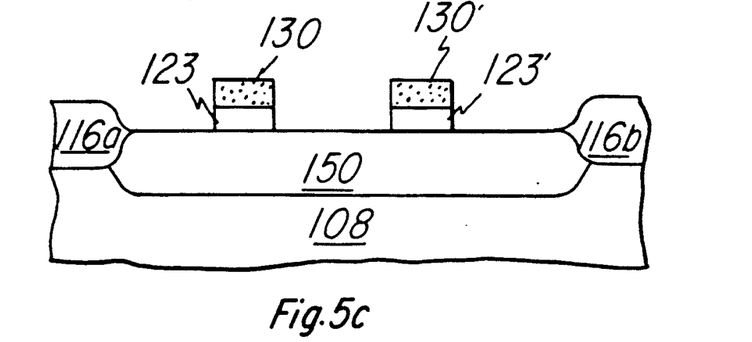

Referring next to FIG. 5c, conductive gate layer 144 and gate insulating layer 142 are patterned and etched to form gate 130 and gate 130' as well as gate insulating layer 123 and 123'. The gates are created using well known process steps to create the gate design of choice as described with reference to FIGS. 1 through 4.

Figure 5D:
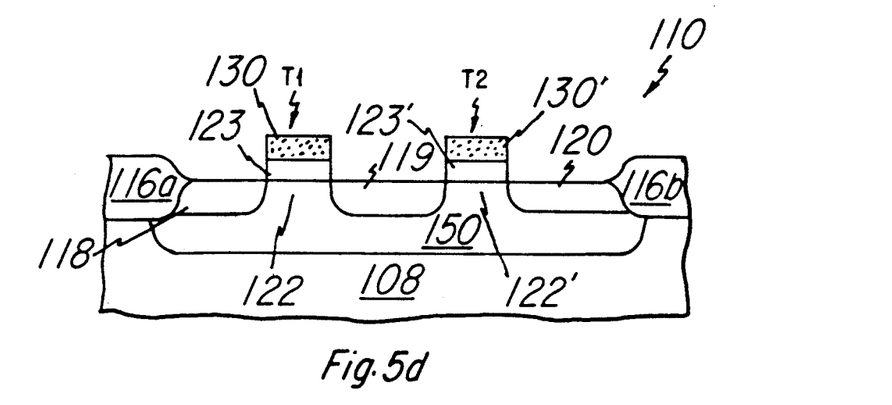

The moat regions 118, 119, and 120 are then doped as illustrated in FIG. 5d. The doping process can be performed by ion implantation or by one of the other well known doping techniques such as diffusion, for example. An annealing step is often performed after doping the moat region. The conductivity type of the dopant in the moat region determines the conductivity of the device, i.e., n-channel or p-channel. As discussed previously, the doping type of the channel 122 and 122' is typically, but not necessarily, different than that of the moat regions 118, 119, and 120.

The cross-sectional view shown in FIG. 5d is a view of the structure illustrated in FIG. 2 along the BB line. As illustrated, channel region 122 along with source region 118 and drain region 119 and gate 130 form transistor T1 and likewise channel region 122' along with source region 120 and drain region 119 and gate 130' form transistor T2. An analogous process flow is used to form the other embodiments described herein.

After the etching of the selected gates is complete, the next step of the illustrative process flow is the deposition of insulating layer 160 over the entire surface of the base cell 110 and the other base cells on the chip. Insulating layer 160 may be formed from a deposited oxide or nitride, for example. Since the base cell pattern is the same for many different application, the cells may be fabricated prior to the design or production of the actual circuit. Insulating layer 160 will protect the device during storage periods if the device is in fact prefabricated.

The next step in the illustrative flow is to etch the selected gates to form the desired circuits. The steps for performing this step will be described in more detail below with reference to FIG. 6.

Figure 5E:
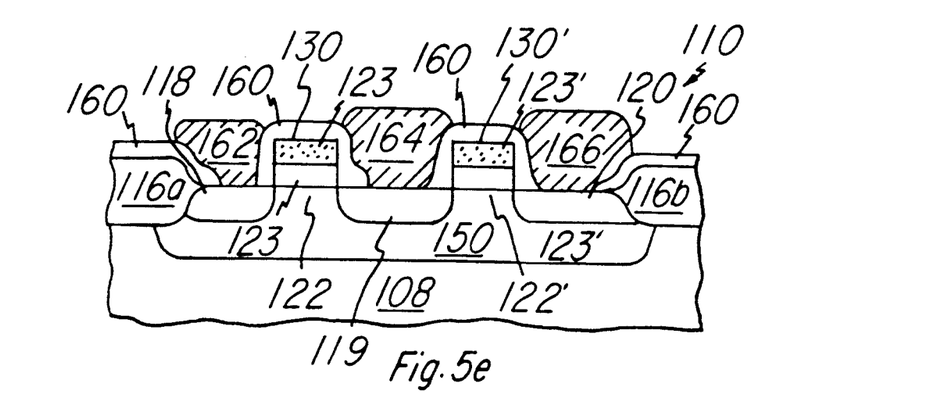

To form the connections required for the desired circuit, a hole is formed in insulating layer 160 and a contact is formed. FIG. 5e illustrates contact 162, contact 164 and contact 166 as examples. One method to form the contact is by etching layer 160 and creating a metallic plug 162 (or 164 or 166), as is well known in the art. The metallic plug 162 (or 164 or 166) may comprise tungsten for example.

Interconnect lines, not shown, are then formed and etched to create the desired connections as previously discussed. The interconnect lines may be formed from a metal such as tungsten or titanium or aluminum. Although not shown, as is well known in the art, a multilevel interconnect scheme may be implemented by forming an additional insulating layer and forming additional interconnect lines.

An illustrative method to etch the gate will now be described to FIG. 6 which shows a cross-sectional view of the cell 10 of FIG. 1 along the AA line.

Referring now to FIG. 6a, a base cell 10 includes moat region 12 and moat region 14 which are separated by insulating region 16. Within the moat region 12 an n-well 50 has been formed. The moat region 12 includes channel region 22 as well as source and drain regions, not shown. Likewise, the moat region 14 includes channel region 28 as well as source and drain regions, not shown.

Insulating layer 23 is formed over channel region 22 and insulating layer 29 is formed over channel region 28. Conductive gate 30 overlies insulating layers 23, 29 and 16.

Referring next to FIG. 6b, resist layer 74 is formed over the surface of array cell 10 if the gate 30 is to be etched. Mask 70 is aligned over the cell and illuminated by energy 72 from an energy source so that the desired pattern is transformed into the base cell 10. Any of the well known photolithography steps may be used to transfer the desired pattern onto the device surface.

Referring now to FIG. 6c, the portion 30c of gate 30 is etched away using any of the well known etching techniques. Resist layer 74 is removed and the wafer is cleaned. At this point in the flow, the insulating layer and interconnects may be formed.

Since only four additional processes (clean, resist coat, align and expose, and etch) are required to cut the gate, the cost impact is negligibly small. Higher gate utilization and higher performance are derived from these additional steps and therefore a lower effective cost is achieved.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a semiconductor gate array structure on a semiconductor substrate comprising the steps of:

forming a plurality of moat regions, each of said moat regions including a channel region and an insulating layer formed over said channel region, said moat regions separated by an insulating region;

forming a gate layer over said moat regions;

etching said gate layer to form a plurality of gates, each of said gates including a first portion over one of said channel regions, a second portion over a channel region adjacent to said one of said channel regions, and a third portion over the insulating region between said one of said channel regions and said adjacent channel region such that each channel region is beneath one gate;

after said step of etching said gate layer to form a plurality of gates, etching said third portion of selected ones of said plurality of gates to form a selected gate configuration.

2. The method of claim 1 wherein said step of forming a plurality of moat regions comprises the step of doping silicon by means of ion implantation.

3. The method of claim 1 wherein said step of forming a plurality of moat regions comprises doping a portion of said moat regions with an n+ dopant and the remaining moat regions with a p+ dopant.

4. The method of claim 3 wherein said step of forming a plurality of gates comprises forming gates wherein said first portion is formed over a p-channel and said second portion is formed over an n-channel.

5. The method of claim 1 wherein said step of etching said gate layer is performed before said selected gate configuration is designed.

6. The method of claim 1 wherein said step of forming a plurality of gates comprises depositing polysilicon.

7. The method of claim 6 wherein said etching step comprises:
cleaning the surface of said substrate;
coating the surface of said substrate with photoresist;
aligning a mask pattern over said surface;
exposing said mask pattern to an energy source; and
etching said polysilicon to form a selected gate configuration.

8. The method of claim 1 and further comprising the steps of:
forming a plurality of contact holes in said second insulating layer; and
forming interconnects over said plurality of contact holes to form transistor devices.

9. The method of claim 1 and further comprising the steps of:
forming a third insulating layer over said array;
forming a plurality of contact holes in said third insulating layer; and
forming interconnects over said plurality of contact holes to form transistor devices.

10. A method for forming an array of base cells comprising:
forming a mask over a portion of a semiconductor substrate surface to define a plurality of first and second active areas;
forming an insulating region on said surface which is not masked;
removing said mask;
doping said plurality of first active areas;
forming a first insulating layer over said first and second active areas;
forming a conductive gate layer over said first insulating layer and over said insulating regions;
patterning and etching said first insulating layer and said conductive gate layer to form a plurality of gates such that each gate is formed over one first active area, one second active area and the corresponding insulating region between said one first and second active area;
doping said active areas;
forming a second insulating layer over said base cell; and
for a selected ones of said plurality of gates, etching the portion of said selected ones formed over said corresponding insulating region between the first and second active area subsequent to said step of patterning and etching said first insulating layer and said conductive gate layer.

11. The method of claim 10 and further comprising the steps of:
forming a plurality of contact holes in said second insulating layer; and
forming interconnects over said plurality of contact holes to form transistor devices.

12. The method of claim 10 wherein said step of forming an insulating region comprises the step of growing an oxide.

13. The method of claim 10 wherein said doping step comprises implanting n-type material.

14. The method of claim 10 wherein said doping step comprises implanting p-type material.

15. The method of claim 10 wherein said steps of forming an insulating layer comprises depositing an oxide.

16. The method of claim 10 wherein said forming a conductive gate layer step comprises depositing polysilicon.

17. A method for forming a plurality of semiconductor devices each having a substantially identical array of base cells, said method comprising the steps of:
forming an array of base cells for each said plurality of semiconductor devices, wherein each said base cells are formed by:
forming at least a first and a second moat region, each of said moat regions including a channel region and an insulating layer formed over said channel region, said first and second moat regions separated by an insulating region;
forming a gate, said gate including a first portion over said channel region of said first moat region, a second portion over said channel region of said second moat region, and a third portion over the insulating region;
forming a second insulating layer over said array; and
for selected base cells of said array of base cells, etching said third portion of said gate such that said first and second portions of said gate are electrically disconnected;
forming a plurality of different interconnect configurations, each said of interconnect configurations corresponding to an array of base cells for one of said plurality of semiconductor devices; and
for each said semiconductor devices, forming a plurality of contact holes in said second insulating layer and forming interconnects over said plurality of contact holes to form said semiconductor devices corresponding to said an array of base cells.

18. The method of claim 17 wherein said steps of forming an array of base cells is performed prior to said forming step for at least one of said semiconductor devices, and wherein said step of etching said third portion is performed subsequent to said forming step for said at least one of said semiconductor devices.

19. The method of claim 17 wherein said first moat region comprises p-doped silicon and said second moat region comprises n-doped silicon.

20. The method of claim 1 and further comprising the step of forming an interconnect line adjacent at least one of said moat regions and wherein said step of etching said third portion of selected ones of said plurality of gates further comprises etching a portion of said interconnect line.

* * * * *